(12) United States Patent
Hsu et al.

(10) Patent No.: US 7,193,267 B2
(45) Date of Patent: *Mar. 20, 2007

(54) CROSS-POINT RESISTOR MEMORY ARRAY

(75) Inventors: Sheng Teng Hsu, Camas, WA (US);
Wei Pan, Vancouver, WA (US);
Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 211 days.

This patent is subject to a terminal disclaimer.

(21) Appl. No.: 10/971,204

(22) Filed: Oct. 21, 2004

(65) Prior Publication Data

US 2005/0083757 A1 Apr. 21, 2005

Related U.S. Application Data

(60) Continuation-in-part of application No. 10/345,547, filed on Jan. 15, 2003, now Pat. No. 6,861,687, which is a division of application No. 09/894,922, filed on Jun. 28, 2001, now Pat. No. 6,531,371, application No. 10/971,204, which is a division of application No. 10/391,292, filed on Mar. 17, 2003, now Pat. No. 6,905,937.

(51) Int. Cl.
*H01L 29/76* (2006.01)
(52) U.S. Cl. .......................... 257/319; 257/295; 438/59
(58) Field of Classification Search ............... 257/295, 257/296, 308, 319, 331; 438/59, 381, 384, 438/385
See application file for complete search history.

(56) References Cited

U.S. PATENT DOCUMENTS 6,232,629 B1 * 5/2001 Nakamura .................. 257/306

\* cited by examiner

*Primary Examiner*—Phuc T. Dang

(74) *Attorney, Agent, or Firm*—David C. Ripma

(57) ABSTRACT

Resistive cross-point memory devices are provided, along with methods of manufacture and use. The memory devices are comprised by an active layer of resistive memory material interposed between upper electrodes and lower electrodes. A bit region located within the resistive memory material at the cross-point of an upper electrode and a lower electrode has a resistivity that can change through a range of values in response to application of one, or more, voltage pulses. Voltage pulses may be used to increase the resistivity of the bit region, decrease the resistivity of the bit region, or determine the resistivity of the bit region. A diode is formed between at the interface between the resistive memory material and the lower electrodes, which may be formed as doped regions. The resistive cross-point memory device is formed by doping lines within a substrate one polarity, and then doping regions of the lines the opposite polarity to form diodes. Bottom electrodes are then formed over the diodes with a layer of resistive memory material overlying the bottom electrodes. Top electrodes may then be added at an angled to form a cross-point array defined by the lines and the top electrodes.

10 Claims, 3 Drawing Sheets

CROSS-POINT RESISTOR MEMORY ARRAY

CROSS-REFERENCE TO RELATED APPLICATIONS

This application is a continuation-in-part of application Ser. No. 10/345,547, filed Jan. 15, 2003, entitled "Electrically Programmable Resistance Cross Point Memory Structure", invented by Sheng Teng Hsu and Wei-Wei Zhuang, now U.S. Pat. No. 6,861,687 which is a divisional of application Ser. No. 09/894,922, filed Jun. 28, 2001, entitled "Electrically Programmable Resistance Cross Point Memory," invented by Sheng Teng Hsu, and Wei-Wei Zhuang, now U.S. Pat. No. 6,531,371, issued Mar. 11, 2003.

Application Ser. No. 10/345,547, filed Jan. 15, 2003, entitled "Electrically Programmable Resistance Cross Point Memory Structure", invented by Sheng Teng Hsu and Wei-Wei Zhuang is incorporated herein by reference.

CROSS-REFERENCE

This application is a divisional of application Ser. No. 10/391,292, filed Mar. 17, 2003, entitled "Methods of Fabricating a Cross-Point Resistor Memory Array," invented by Sheng Teng Hsu, Wei Pan, and Wei-Wei Zhuang, now U.S. Pat. No. 6,905,937, which is hereby incorporated by reference.

BACKGROUND OF THE INVENTION

New materials, referred to herein as resistive memory materials, are now making it possible to produce non-volatile memory cells based on a change in resistance. Materials having a perovskite structure, among them colossal magnetoresistance (CMR) materials, are materials that have electrical resistance characteristics that can be changed by external influences.

For instance, the properties of materials having perovskite structures, especially CMR materials, can be modified by applying one or more short electrical pulses to a thin film or bulk material. The electric field strength or electric current density from the pulse, or pulses, is sufficient to switch the physical state of the materials so as to modify the properties of the material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity, or the same polarity but with wider width, from those used to induce the initial change.

SUMMARY OF THE INVENTION

Accordingly, a memory structure is provided, which comprises a substrate with a plurality of doped lines, for example n-type bit lines, with regions of the opposite dopant, for example p-type regions, formed into the n-type bit lines to form diodes. Bottom electrodes overly the diodes. A layer of resistive memory material overlies the bottom electrodes. Top electrodes overly the resistive memory material. In a preferred embodiment, the top electrodes form a cross-point array with the doped lines, and the diodes are formed at each cross-point.

A method of manufacturing the memory structure is also provided. A substrate is provided and a plurality of doped lines, such as n-type bit lines, are formed on the substrate. Diodes are formed at what will become each cross-point of the cross-point array. The diodes are formed by doping a region of the doped lines to the opposite polarity, for example by implanting ions. Bottom electrodes are then formed over the diodes. A layer of resistive memory material is deposited over the bottom electrodes. Top electrodes are then deposited overlying the resistive memory material above the diodes such that a cross-point array is defined by the doped lines and the top electrodes, with a diode located at each cross-point. It may be possible, or even preferred, to achieve the method of manufacture in such a way the doped line, the diode formation, and the bottom electrode formation are all self aligned.

DETAILED DESCRIPTION OF THE INVENTION

Figure 1:
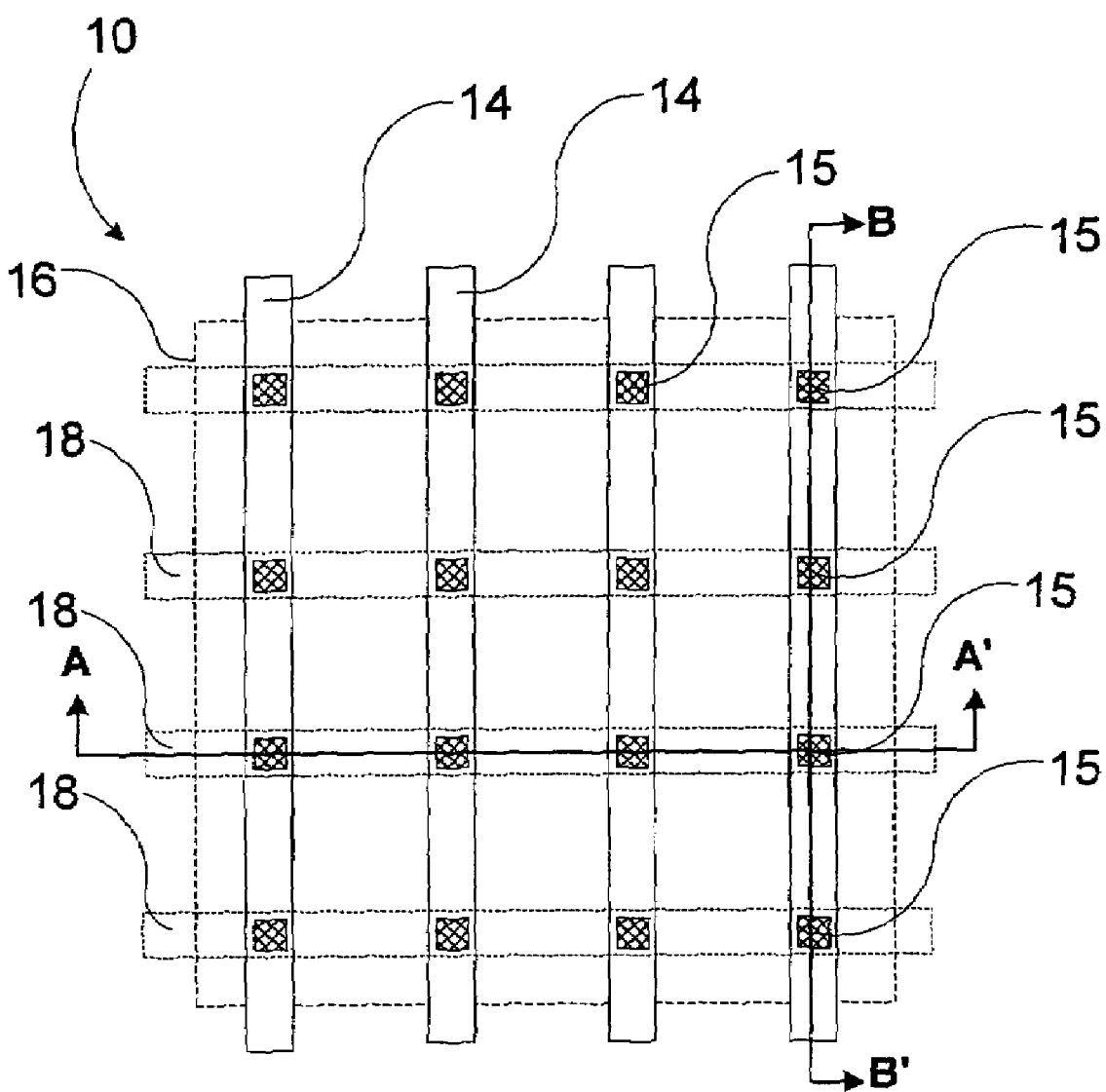
FIG. 1 is a top view on a resistive memory array.

FIG. 1 shows a cross-point memory array area 10. The memory array area 10 comprises a substrate with a plurality lines 14 formed thereon. The lines 14 may be doped lines. Diodes 15 may comprise a doped portion of the lines 14 with the opposite polarity dopants. An active layer 16 of resistive memory material overlies the plurality of lines 14. A plurality of top electrodes 18 overly the active layer 16, such that the active layer 16 is interposed between the diodes 15 and the top electrodes 18.

The top electrodes 18 and the lines 14 are each preferably substantially parallel rows. The top electrodes 18 and the lines 14 are arranged in a cross-point arrangement such that they cross each other in a regular pattern. A cross-point refers to each position where a top electrode 18 crosses a line 14. As shown, the top electrodes and the lines are arranged at substantially 90 degrees with respect to each other. The top electrodes and the lines can each function as either word lines or bit lines as part of a cross-point memory array. As shown, the lines 14 are bit lines that have been doped as n-type lines, which are also referred to as N+ bit lines when they are heavily doped n-type lines.

FIG. 1 shows just the memory array area. It should be clear that in an actual device, the substrate, the lines 14 and the top electrodes 18 may extend well beyond the memory array area, which is defined by the active layer 16. In one embodiment the active layer is substantially continuous, such that the active layer extends across more than one cross-point. The lines 14 and the top electrodes 18 may connect to other support circuitry, which is not shown, on the same substrate.

FIGS. 2–9 illustrate the process for forming a resistive memory array. Those figures denoted with an A correspond to a cross-section taken along A–A' in FIG. 1. Likewise, those figures denoted with a B correspond to a cross-section taken along B–B' in FIG. 1.

Follow any state of the art process to form the supporting electronics. The resistive memory array will preferably be fabricated in a p-well or using a p-type substrate. Support electronics are defined here as any non-memory devices, which may be connected to the resistive memory array, such as coding, decoding, data processing or computing circuitry.

Figure 2A:
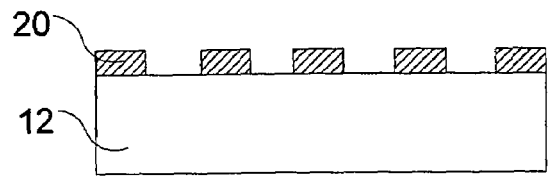
FIGS. 2A and 2B are a cross-section corresponding to A–A' and B–B' respectively in FIG. 1 during initial processing.
Figure 2B:
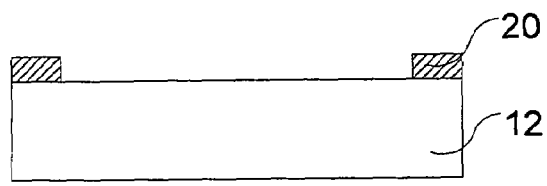

Referring now to FIGS. 2A and 2B, in one embodiment a layer of oxide 20 is deposited overlying the substrate 12. The substrate is any suitable substrate material, for example silicon. The layer of oxide 20 is preferably in the range of between approximately 100 nm and 500 nm. Photoresist, which is not shown, is then deposited and patterned to produce a pattern of preferably parallel lines over the memory array area 10. The layer of oxide 20 is then etched to form a series of preferably parallel lines exposing the underlying substrate 12.

In an alternative embodiment, a layer of polysilicon, not shown, may be deposited over the layer of oxide 20 prior to depositing the photoresist. The layer of polysilicon is preferably between approximately 50 nm and 100 nm. The layer of polysilicon is also patterned along with the layer of oxide 20. This optional layer of polysilicon may be used as a polishing stop for a subsequent CMP polishing step.

Figure 3A:
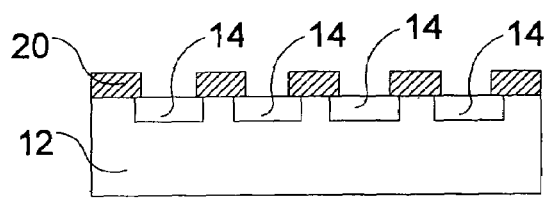
FIGS. 3A and 3B are a cross-section corresponding to A–A' and B–B' respectively in FIG. 1 during processing.
Figure 3B:
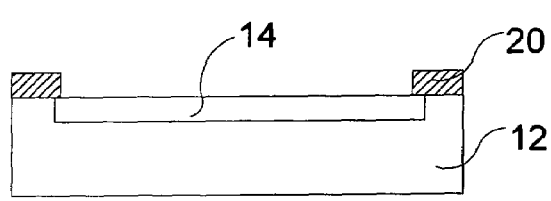

An n-type dopant, such as phosphorous, or arsenic, is implanted into exposed substrate 12 to form n-type bit lines 14 as shown in FIGS. 3A and 3B.

Figure 4A:
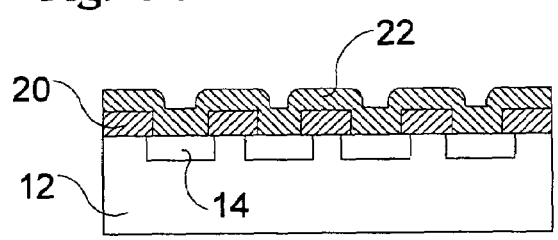
FIGS. 4A and 4B are a cross-section corresponding to A–A' and B–B' respectively in FIG. 1 during processing.
Figure 4B:
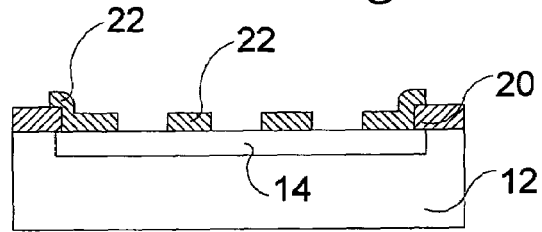

A silicon nitride layer 22 is deposited overlying the layer of oxide 20, and the n-type bit lines. The silicon nitride layer 22 is deposited to a thickness of preferably between approximately 100 nm and 500 nm. The silicon nitride layer 22 is patterned. Preferably, the silicon nitride layer 22 will be formed as parallel lines which are perpendicular to the bit lines 14, as shown in FIGS. 4A and 4B. Preferably, the memory cells will be formed in the area where the silicon nitride layer lines cover the n-type bit lines following subsequent processing.

In an alternative embodiment, a silicidation process may be performed to form a silicide where the n-type bit lines 14 are exposed. This silicidation process may reduce the bit line resistance.

Figure 5A:
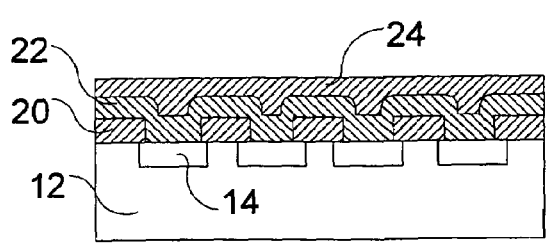
FIGS. 5A and 5B are a cross-section corresponding to A–A' and B–B' respectively in FIG. 1 during processing.
Figure 5B:
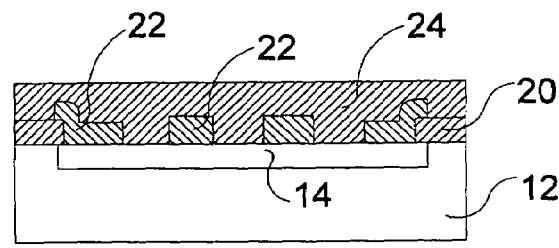

Oxide 24 is then deposited to a thickness of between approximately 200 nm and 700 nm, as shown in FIGS. 5A and 5B.

Figure 6A:
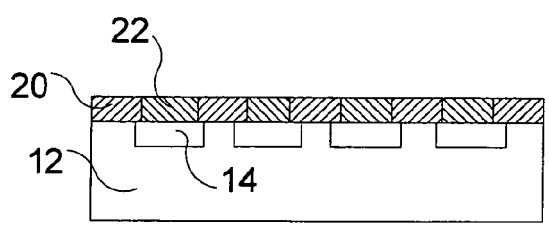
FIGS. 6A and 6B are a cross-section corresponding to A–A' and B–B' respectively in FIG. 1 during processing.
Figure 6B:
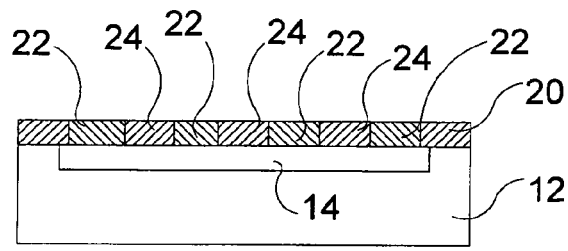

The oxide 24 and the silicon nitride layer 22 are then polished, preferably using CMP. The oxide 24 and the silicon nitride layer 22 are preferably polished to stop at the layer of oxide 20. Alternatively, if a layer of polysilicon was deposited over the layer of oxide 20 prior to depositing the silicon nitride layer 22, the layer of polysilicon may be used as a polishing stop. If a layer of polysilicon is used as the polishing stop, the remaining polysilicon is removed following the polishing. Regardless whether a polysilicon polish stop is used and removed, or not used at all, the resulting structure is substantially as shown in FIGS. 6A and 6B.

Figure 7A:
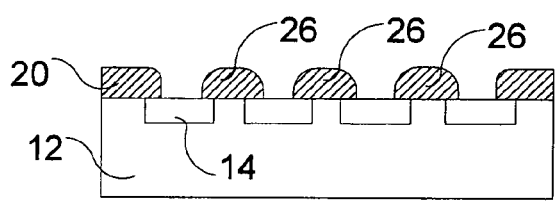
FIGS. 7A and 7B are a cross-section corresponding to A–A' and B–B' respectively in FIG. 1 during processing.
Figure 7B:
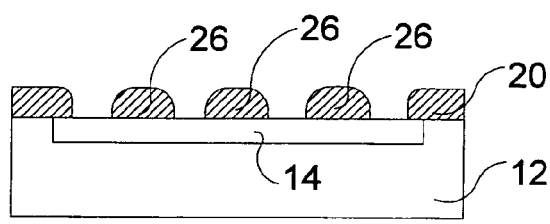

After polishing the oxide 24 and the silicon nitride layer 22, the silicon nitride layer 22 is removed, for example using a wet etch. A CVD oxide is then deposited overlying the substrate, including the remaining portions of the oxide 24. The CVD oxide is preferably deposited to a thickness of between approximately 10 nm and 50 nm. A plasma etch is used to etch the CVD oxide stopping at the substrate 12. The CVD oxide deposition and plasma etch forms oxide spacers 26 as shown in FIGS. 7A and 7B, while exposing a region within the n-type bit lines 14.

Figure 8A:
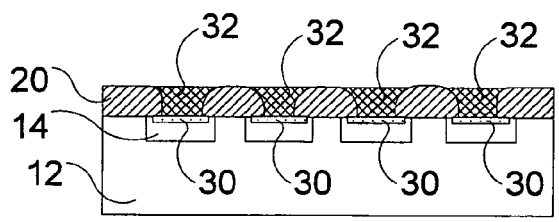
FIGS. 8A and 8B are a cross-section corresponding to A–A' and B–B' respectively in FIG. 1 during processing.
Figure 8B:
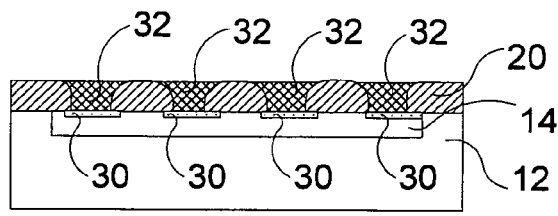

Referring now to FIGS. 8A and 8B, P+ dots 30 are formed within the exposed regions of the n-type bit lines 14. The P+ dots 30 may be formed by ion implantation forming a shallow P+ junction. In one embodiment boron ions are implanted using energies in the range of between approximately 5 keV and 15 keV at a dose of between approximately $1 \times 10^{15}/cm^2$ and $5 \times 10^{15}/cm^2$. In an alternative embodiment, $BF_2$ ions are implanted at energies between approximately 40 keV and 80 keV at a dose of between approximately $1 \times 10^{15}/cm^2$ and $5 \times 10^{15}/cm^2$.

A bottom electrode material, such as platinum, iridium, ruthenium, or other suitable material, is deposited to a thickness of between approximately 20 nm and 500 nm over the substrate 12, including the P+ dots 30. The bottom electrode material is then planarized, for example using CMP, to form the bottom electrodes 32.

In a preferred embodiment, a layer of barrier material, not shown, is deposited to a thickness of between approximately 5 nm and 20 nm prior to depositing the bottom electrode material. The barrier material is preferably TiN, TaN, WN, TiTaN or other suitable barrier material. The barrier material will also be planarized along with the bottom electrode material. The presence of the barrier material reduces, or eliminates, the formation of silicide at the interface between the bottom electrodes 32 and the P+ dots 30.

The n-type bit lines 14, the P+ dots 30 and the bottom electrodes 32 are preferably self-aligned using the process described. This self-alignment will preferably minimize the cell size of each memory cell within the memory array.

Figure 9A:
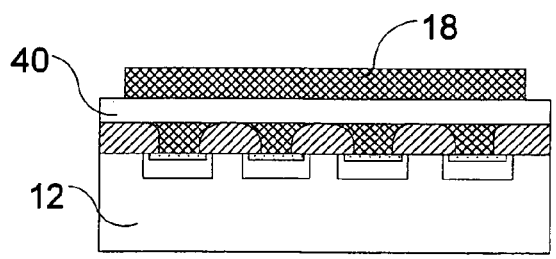
FIGS. 9A and 9B are a cross-section corresponding to A–A' and B–B' respectively in FIG. 1 as shown.
Figure 9B:
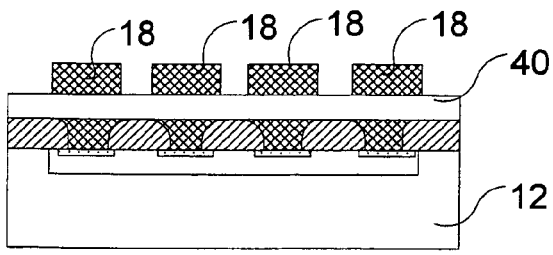

Referring now to FIGS. 9A and 9B, a layer of resistive memory material 40 is deposited over the bottom electrodes within the memory array area. The resistive memory material 40 is preferably a perovskite material, such as a colossal magnetoresistive (CMR) material or a high temperature superconducting (HTSC) material, for example $Pr_{0.7}Ca_{0.3}MnO_3$ (PCMO). Another example of a suitable material is $Gd_{0.7}Ca_{0.3}BaCo_2O_{5+\delta}$. The resistive memory material 40 is preferably between about 5 nm and 500 nm thick. The resistive memory material 40 can be deposited using any suitable deposition technique including pulsed laser deposition, rf-sputtering, e-beam evaporation, thermal evaporation, metal organic deposition, sol gel deposition, and metal organic chemical vapor deposition. The resistive memory material 40 is removed from outside the memory array area by ion milling or other suitable process thereby forming the active layer 16. It is also possible to form a large recessed area to deposit perovskite material over and then use chemical mechanical polishing (CMP) to form the active layer 16.

Top electrodes 18 are formed over the resistive memory material 40 forming the active layer 16 by depositing and patterning a layer of platinum, iridium, copper, silver, gold, or other suitable material. The top electrodes are preferably parallel to each other and preferably perpendicular to the n-type bit lines 14. The structures shown in FIGS. 9A and 9B correspond cross-sections of the top view shown in FIG. 1.

In one embodiment, the memory array structure is passivated and interconnected to supporting circuitry or other devices formed on the same substrate. It may also be possible to combine some of the steps discussed above, with those used to form the support circuitry.

The examples provided above all utilized n-type doped lines on a p-type substrate or p-well, with P+ dots to form the diodes. In this configuration the doped lines may act as the bit lines. However, the n-type lines may alternatively act as word lines by changing the polarity of the electrical signal used in connection with the memory array. It is also possible to construct a resistive memory array with the opposite polarity. The doped lines would be p-type lines, formed in an n-type substrate or n-well, with N+ dots to form the diodes. The p-type lines would either act as word lines or bit lines depending on the electrical polarity used in connection with the resistive memory array.

Although various exemplary embodiments have been described above, it should be understood that additional variations may be made within the scope of the invention, which is defined by the claims and their equivalents.

What is claimed is:

1. A memory structure comprising;
    a) a substrate;
    b) a plurality of doped lines overlying the substrate;
    c) a plurality of top electrodes overlying the doped bit lines at an angle, whereby a cross-point is formed at each location where a top electrode crosses a doped bit line;
    d) a plurality of diodes comprising the doped lines and a doped region of opposite polarity in contact with the doped lines, with each doped region located at a cross-point;
    e) a plurality of bottom electrodes overlying the plurality of diodes; and
    f) a resistive memory active layer interposed between the plurality of top electrodes and the plurality of bottom electrodes.

2. The memory structure of claim 1, wherein the doped lines are bit lines.

3. The memory structure of claim 1, wherein the doped lines are a n-type lines.

4. The memory structure of claim 1, wherein the doped lines are n-type bit lines and each doped region is a p-type region.

5. The memory structure of claim 1, wherein the bottom electrodes are platinum, iridium, or ruthenium.

6. The memory structure of claim 1, wherein the resistive memory active layer is a perovskite material.

7. The memory structure of claim 1, wherein the resistive memory active layer is a colossal magnetoresistance (CMR) material.

8. The memory structure of claim 1, wherein the resistive memory active layer is $Pr_{0.7}Ca_{0.3}MnO_3$ (PCMO).

9. The memory structure of claim 1, wherein the resistive memory active layer is $Gd_{0.7}Ca_{0.3}BaCo_2O_{5+5}$.

10. The memory structure of claim 1, wherein the resitive memory active layer is continuous, whereby it crosses over multiple cross-points.

* * * * *

UNITED STATES PATENT AND TRADEMARK OFFICE
CERTIFICATE OF CORRECTION

PATENT NO. : 7,193,267 B2
APPLICATION NO. : 10/971204
DATED : March 20, 2007
INVENTOR(S) : Sheng Teng Hsu, Wei Pan and Wei-Wei Zhuang It is certified that error appears in the above-identified patent and that said Letters Patent is hereby corrected as shown below:

On the Title page, under "Related U.S. Application Data"

Change: (60) Continuation-in-part of application Ser. No. 10/345,547, filed on Jan. 15, 2003, now Pat. No. 6,861,687 which is a division of application No. 09/894,922, filed Jun. 28, 2001, now Pat. No. 6,531,371, application No. 10/971,204, which is a division of application No. 10/391,292, filed on Mar. 17, 2003, now Pat. No. 6,905,937.

To read: (60) Division of application No. 10/391,292, filed on Mar. 17, 2003, now Pat. No. 6,905,937, which is a continuation-in-part of application No. 10/345,547, filed on Jan. 15, 2003, now Pat. No. 6,861,687, which is a division of application No. 09/894,922, filed on Jun. 28, 2001, now Pat. No. 6,531,371.

Column 1, lines 6-27, under "CROSS-REFERENCE TO RELATED APPLICATIONS," change the following:

This application is a continuation-in-part of application Ser. No. 10/345,547, filed Jan. 15, 2003, entitled "Electrically Programmable Resistance Cross Point Memory Structure", invented by Sheng Teng Hsu and Wei-Wei Zhuang, now U.S. Pat. No. 6,861,687 which is a divisional of application Ser. No. 09/894,922, filed Jun. 28, 2001, entitled "Electrically Programmable Resistance Cross Point Memory," invented by Sheng Teng Hsu, and Wei-Wei Zhuang, now U.S. Pat. No. 6,531,371, issued Mar. 11, 2003.

Application Ser. No. 10/345, 547, filed Jan. 15, 2003, entitled "Electrically Programmable Resistance Cross Point Memory Structure", invented by Sheng Teng Hsu and Wei-Wei Zhuang is incorporated herein by reference.

CROSS-REFERENCE

This application is a divisional of application Ser. No. 10/391,292, filed Mar. 17, 2003, entitled "Methods of Fabrication a Cross-Point Resistor Memory Array," invented by Sheng Teng Signed and Sealed this
Eighth Day of January, 2013

David J. Kappos
*Director of the United States Patent and Trademark Office*

Hsu, Wei Pan, and Wei-Wei Zhuang, now U.S. Pat. No. 6,905,937, which is hereby incorporated by reference.

Column 1, lines 6-27 under "CROSS-REFERENCE TO RELATED APPLICATIONS" is changed to read:

This application is a divisional of application Ser. No. 10/391,292, filed March 17, 2003, entitled "Methods of Fabricating a Cross-Point Resistor Memory Array," invented by Sheng Teng Hsu, Wei Pan, and Wei-Wei Zhuang, now U.S. Pat. No. 6,905,937, which is a continuation-in-part of application Ser. No. 10/345,547, filed Jan. 15, 2003, entitled "Electrically Programmable Resistance Cross Point Memory Structure," invented by Sheng Teng Hsu and Wei-Wei Zhuang, now U.S. Pat. No. 6,861,687, which is a divisional of application Ser. No. 09/894,922, filed Jun. 28, 2001, entitled "Electrically Programmable Resistance Cross Point Memory," invented by Sheng Teng Hsu and Wei-Wei Zhuang, now U.S. Pat. No. 6,531,371, issued Mar. 11, 2003.

Application Ser. No. 10/345,547, filed Jan. 15, 2003, entitled "Electrically Programmable Resistance Cross Point Memory Structure," invented by Sheng Teng Hsu and Wei-Wei Zhuang is incorporated herein by reference. Application Serial Number 10/391,292, filed March 17, 2003, entitled "Methods of Fabricating a Cross-Point Resistor Memory Array," invented by Sheng Teng Hsu, Wei Pan, and Wei-Wei Zhuang is incorporated herein by reference.